United States Patent [19]

Horioka et al.

[11] Patent Number: 4,595,601
[45] Date of Patent: Jun. 17, 1986

[54] METHOD OF SELECTIVELY FORMING AN INSULATION LAYER

[75] Inventors: Keiji Horioka, Kawasaki; Haruo Okano, Tokyo; Makoto Sekine, Yokohama, all of Japan

[73] Assignee: Kabushiki Kaisha Toshiba, Kawasaki, Japan

[21] Appl. No.: 736,211

[22] Filed: May 20, 1985

[30] Foreign Application Priority Data

May 25, 1984 [JP] Japan ................................ 59-105999
Jul. 13, 1984 [JP] Japan ................................ 59-144423
Jul. 13, 1984 [JP] Japan ................................ 59-144424

[51] Int. Cl.$^4$ .............................................. B05D 3/06
[52] U.S. Cl. ................................. 427/53.1; 427/54.1; 427/93; 427/94
[58] Field of Search .................... 427/53.1, 54.1, 93, 427/94

[56] References Cited

U.S. PATENT DOCUMENTS 3,364,087  1/1968  Solomon et al. ..................... 156/635
4,298,629 11/1981  Nozaki et al. ........................ 427/53.1
4,495,218  1/1985  Azuma et al. ........................ 427/53.1
4,539,221  9/1985  Jacob et al. .......................... 427/53.1

Primary Examiner—John H. Newsome
Attorney, Agent, or Firm—Oblon, Fisher, Spivak, McClelland & Maier

[57] ABSTRACT

An insulation layer is selectively formed by exposing the surface of a workpiece to an atmosphere comprising a mixture of a halogen-based gas and a raw gas containing a compoundable element chemically bondable with an element of a material constituting surface layer of the workpiece to form an insulating compound. The surface layer of the workpiece is formed of a non-insulating material, such as a metallic material or a semiconductor material. Light rays are directly irradiated on the selected region or regions of the surface of the workpiece through the atmosphere of the gaseous mixture, thereby dissociating said halogen-based gas. As a result, a layer comprising the insulating compound is formed on the selected region of the surface of the workpiece on which the light rays have been directly irradiated.

20 Claims, 16 Drawing Figures

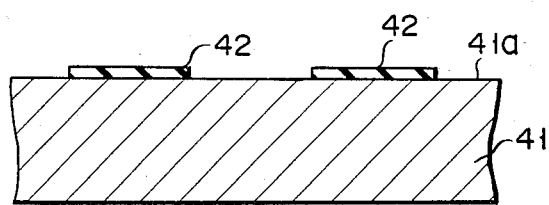
F I G. 8A
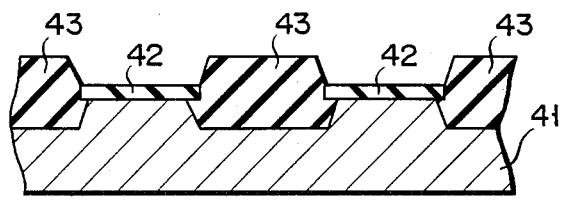
F I G. 8B
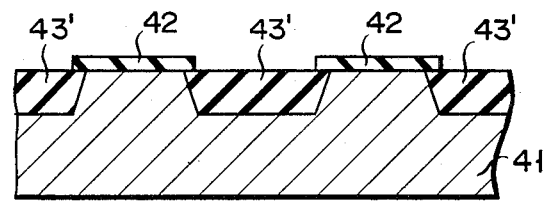
F I G. 8C
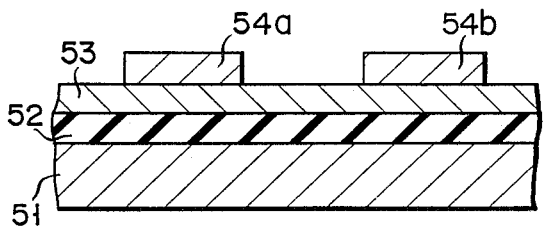
F I G. 9A
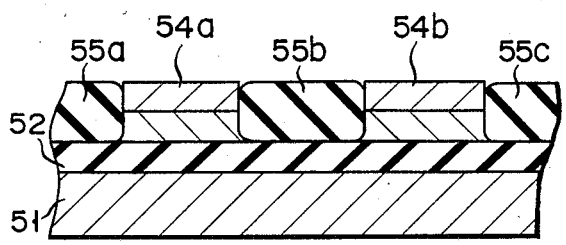
F I G. 9B

METHOD OF SELECTIVELY FORMING AN INSULATION LAYER

BACKGROUND OF THE INVENTION (i) Field of the Invention

This invention relates to a method of selectively forming an insulation layer and, more particularly, to a method of selectively forming on a workpiece an insulation layer prepared from an insulating material containing an element involved in the material forming the workpiece.

(ii) Description of the Prior Art

An insulation layer is one of the important constituent members of a semiconductor integrated circuit device (hereinafter referred to as "IC device"). The most widely accepted process of providing an insulation layer for the IC device whose substrate is formed of, for example, silicon comprises heating the silicon substrate placed in a furnace through which oxygen gas streams are made to flow, thereby forming a silicon oxide layer on the substrate. During the oxidation process, it is necessary to raise the furnace temperature to a high level such as 800° C. to 1000° C. Consequently, a silicon wafer is often broken or warped while being taken into or out of the furnace. Since the recent trend is toward the enlargement of a wafer, the above-mentioned drawback will become more serious in the future.

With the MOS IC device, it is customarily practised to provide a thin oxide layer having a thickness of less than one micron in order to separate the respective elements from each other. The common process of forming such an element-isolating oxide layer is represented by the so-called local oxidation of silicon (LOCOS) process which involves the application of a silicon nitride layer as an oxidation-resistant mask (namely, a mask against oxygen diffusion). The LOCOS process necessarily involves deposition, selective etching and removal of a silicon nitride layer. In addition, a silicon oxide layer must be formed between the silicon nitride layer and silicon substrate to reduce thermal stresses occurring therebetween. If, therefore, an insulation layer-selectively depositing process can be developed which can selectively form an insulation layer and allows for the application of a silicon oxide layer as a mask against oxygen diffusion, then it will be possible to shorten the steps of manufacturing an IC device and reduce its cost.

Another problem in manufacturing the IC device is that a stepped portion appears between the wiring and other sections, particularly the insulation layer. If such a stepped portion is formed, the lithography will decrease in precision, leading to a decline in the performance of the resulting IC device, when a wiring or interconnection layer has been formed over the stepped portion. Therefore, if the process is developed which enables an insulation layer to be selectively formed for insulating the respective wiring layers without the appearance of a stepped portion between the wiring and insulation layers, then it will be possible to elevate the performance of the IC device and increase its yield.

SUMMARY OF THE INVENTION

It is accordingly an object of this invention to provide a method of selectively forming an insulation layer on a workpiece, with high efficiency and at a low temperature.

To attain the above-mentioned object, this invention provides a method of selectively forming an insulation layer, which comprises exposing the surface of a workpiece to an atmosphere comprising a mixture of a halogen-based gas and a raw gas containing an element chemically bondable with an element of a material constituting the surface layer of the workpiece to form an insulating compound. The surface layer of the workpiece is formed of a non-insulating material, such as a metallic material or a semiconductor material.

Light rays are directly irradiated on the selected region or regions of the surface of the workpiece through the atmosphere of the gaseous mixture, thereby dissociating said halogen-based gas. As a result, a layer comprising the insulating compound is formed on the selected region of the surface of the workpiece on which the light rays have been directly irradiated.

In a first embodiment of this invention, the selected region or regions of the surface of the workpiece are defined by a mask selectively deposited on the surface of the workpiece.

In a second embodiment of the invention, light rays are selectively irradiated only on the selected region or regions of the surface of the workpiece without forming the mask. In this case, the selected region of the surface of the workpiece may be scanned by light beams whose flux bears a prescribed sectional form.

It will be noted that throughout the specification and claims, an insulating compound or material produced according to the method of this invention may sometimes be referred to as a "photo" or "photochemical" insulating material, for instance, photo-oxide or photochemical silicon dioxide.

BRIEF DESCRIPTION OF THE DRAWINGS

FIGS. 8A to 8C are sectional views illustrating the process of forming a silicon oxide layer according to the invention;

FIGS. 9A and 9B are sectional views illustrating the process of forming a buried insulation layer according to the invention;

DETAILED DESCRIPTION OF THE PREFERRED EMBODIMENTS

Figure 1:
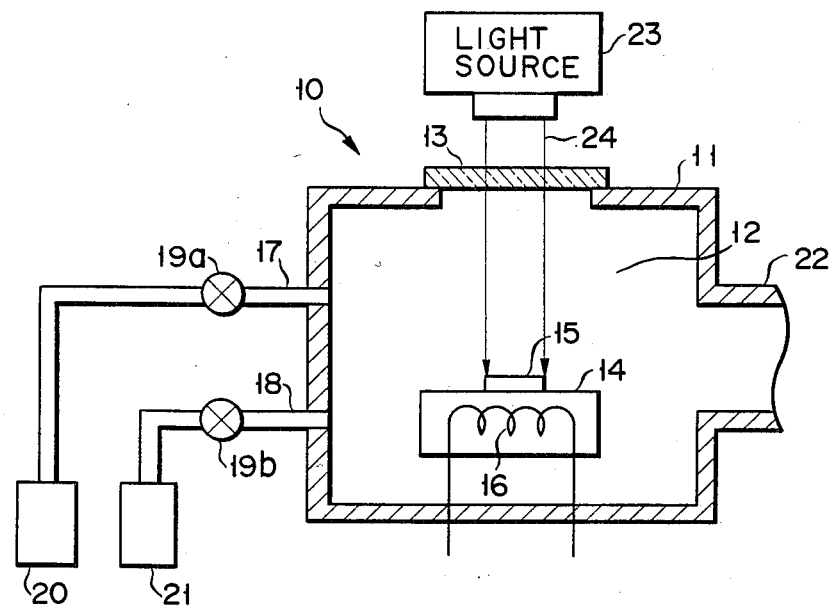
FIG. 1 schematically illustrates a photochemical reaction device used in for carrying out the method of this invention.
Figure 2:
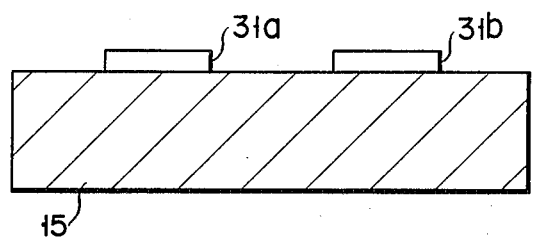
FIG. 2 is a sectional view illustrating the means of directly irradiating light rays only on the selected region of the surface of a workpiece according to the invention.

This invention will now be described in detail with reference to the accompanying drawings. FIG. 1 schematically illustrates a photochemical reaction device adapted for carrying out this invention. The photochemical reaction device 10 is provided with a vacuum vessel 11 defining a reaction chamber 12 therein. The top surface of the vessel 11 is integrally fitted with a window 13 formed of a material (e.g., quartz) permeable to the light rays applied to initiate the later described photochemical reaction. A susceptor 14 on which a workpiece 15 is to be placed is held in the reaction chamber 12. The susceptor 14 is fitted with a heater 16 to heat the workpiece 15.

One side of the vessel 11 is connected to a pipe 17 for introducing into the reaction chamber 12 a raw gas containing an element (compoundable element) which can form an insulating material by chemically bonding with the element in the material forming at least the surface layer of the workpiece 15, and also to a pipe 18 for introducing a gas (halogen-based gas) containing a halogen element into the reaction chamber 12. These pipes 17, 18 are connected to the sources 20, 21 of the above-mentioned gases by means of the corresponding valves 19a, 19b. The opposite side of the vessel 11 is connected to a gas exhaust port 22 through which the reaction chamber 12 is evacuated.

Provided outside of the vessel 11 and above the quartz window 13 is a light source 23 from which light rays 24 are issued to commence the photochemical reaction according to this invention. The light source 23 may be provided by a unit emitting a light beam having a single wavelength (for example, 308 nm) required for the dissociation of the halogen-based gas (for example, an excimer laser or carbon dioxide laser), or by a unit emitting a light beam having continuous or discontinuous wavelengths including a wavelength required for the dissociation of the halogen-based gas (for example, a halogen lamp or mercury lamp).

The material constituting at least the surface layer of the workpiece which is converted into an insulating material according to this invention includes a metallic material such as aluminium, zinc, or an alloy whose one component is constituted by any of these metals; and a semiconductor material such as silicon (of the single crystal, polycrystal or amorphous type) which is or is not doped with an impurity of the n or p type conductivity, and a compound semiconductor such as GaAs and InSb.

The raw gas which produces an insulation layer by chemically bonding with the element of the material constituting at least the surface layer of the workpiece in accordance with this invention includes an oxygen-based gas such as oxygen, nitrogen dioxide ($NO_2$) or dinitrogen oxide ($N_2O$), if the insulating material to be formed is an oxide. If the insulating material to be formed is a nitride, the raw gas includes a nitridizing gas such as ammonia or hydrazine which does not substantially contain oxygen, namely does not involve oxygen in an amount sufficient to oxidize the material of the workpiece (an oxide is produced in preference to a nitride). If the insulation material to be formed is a sulfide, the raw gas includes a sulfidizing gas such as sulfur or hydrogen sulfide.

The halogen-based gas constituting a reactive atmosphere together with the raw gas includes halogen gases, that is, chlorine gas, iodine gas, bromine gas and fluorine gas, and halogen compounds such as nitrogen trifluoride, boron trichloride, fluorocarbon (e.g. monofluoromethane, difluoromethane, trifluoromethane and carbon tetrafluoride), and silicon tetrachloride.

In order to form the insulating material only on the selected regions of the surface of the workpiece according to this invention using the photochemical reaction device 10 shown in FIG. 1, the workpiece 15 is placed on the susceptor 14 held in the reaction chamber 12.

The reaction chamber 12 is decompressed by deaerating through the exhaust port 22 to reduce the pressure of the interior of the chamber 12 to about $10^{-2}$ Torr. The raw material gas and halogen-based gas are then introduced into the reaction chamber 12 from the corresponding sources 20, 21 with their flow rates controlled to a proper level by the respective valves 19a, 19b.

After both gases are introduced, the workpiece 15 is heated to a prescribed temperature by the heater 16. The heating temperature is set at a sufficiently lower level (but not less than room temperature) than the customary thermal oxidation temperature. The temperature at which the insulation material can be produced at a practically acceptable speed is preferred to be 100° C. to 400° C. If the temperature exceeds 450° C., substantially no insulation layer is formed. The particularly preferred temperature ranges between 250° C. and 350° C.

Next, while the surface temperature of the workpiece 15 is maintained at the above-mentioned prescribed level, light rays to dissociate the halogen-based gas into a radical are directly irradiated from the source 23 through the quartz window 13 only on the selected regions of the surface of the workpiece 15. Two measures can be taken to directly irradiate the light rays only on the selected regions of the surface of the workpiece 15. The first measure involves selectively forming one or more masks 31a, 31b on the surface of the workpiece 15. Light rays are projected on the entire surface of the workpiece 15 provided with the masks 31a, 31b. Consequently, only those portions of the surface which are not covered with the masks 31a, 31b directly receive light rays. The masks 31a, 31b should not be etched by the later described halogen radical, nor subject to the oxidizing, nitridizing, or sulfuridizing reaction corresponding to the raw gas used. The mask can be prepared from, for example, a silicon oxide (natural silicon oxide, thermal silicon oxide or CVD silicon oxide) or alumina or aluminium layer whose surface is coated with an aluminium oxide layer (aluminium metal is generally oxidized by the ordinary atmosphere, and has its surface formed of a thin alumina layer). The silicon oxide is permeable to the above-mentioned light, thereby allowing the light to permeate the silicon oxide mask and reach the surface of the workpiece 15. However, the light does not directly reach the workpiece surface, but indirectly reaches it through the mask. Those portions of the surface of the workpiece 15 which are covered with the mask are not or almost not involved in the under-mentioned reaction. The first measure is applicable, when the surface layer of workpiece 15 is prepared from any of the previously listed metallic or semiconductor material.

The second measure of directly irradiating light rays only on the selected regions of the surface of the workpiece 15 involves directly scanning the selected regions of the surface of the workpiece 15 by the light rays as a beam having a flux bearing a prescribed sectional form. The scanning process by the light rays is already well known to the art. For instance, it is possible to scan the beam only on the selected regions of the surface of the workpiece 15 while the beam is moved by means of a mirror or by fixing the beam and letting the workpiece 15 move by the X-Y table. Only those portions of the workpiece 15 which are scanned by light rays are involved in the under-mentioned reaction, causing an insulating material to be formed on the scanned portions. However, the second measure is not applicable if the surface layer of the workpiece 15 is prepared from $n^+$ type silicon (containing an impurity of n type conductivity at a concentration of $10^{20}/cm^3$ to $10^{-2}/cm^3$). If the workpiece 15 is formed of n+ type silicon, an insulating material is formed even on those portions of the surface of the workpiece 15 which are not exposed to light rays.

When light rays are brought into the reaction chamber 12, the halogen-based gas is dissociated by the action of the introduced light rays, thereby generating a halogen radical or radicals. This halogen radical etches the metal material or semiconductor material constituting at least the surface layer of the workpiece 15, and reacts with the constituent element of the surface layer of the workpiece 15, thereby producing the corresponding halides such as aluminium halide, zinc halide, and silicon halide. These halide compounds are volatile, and are readily mixed with the interior atmosphere of the reaction chamber 12. The raw material gas is already present in the interior atmosphere of the reaction chamber 12. This raw material gas chemically reacts with the halide while being acted on by the halide radical, thereby producing the corresponding insulating compound or material, which in turn is deposited on the selected regions of the surface of the workpiece 15.

A detailed description may now be made of the above-mentioned reaction mechanism, assuming that the workpiece is entirely prepared from silicon, the raw material gas is oxygen, and a halogen-based gas is chlorine. The chlorine gas generates a chlorine radical (Cl.) by the action of light rays in accordance with the undermentioned formula (1). The chlorine radical etches the silicon mass, and reacts with silicon to produce silicon chloride in accordance with the following formula (2). The silicon chloride reacts with oxygen gas contained in the interior atmosphere of the reaction chamber 12 to form silicon dioxide in accordance with the following formula (3). This silicon dioxide is deposited on the surface of the workpiece 15. The chlorine gas generated as a hyproduct is again mixed with the interior atmosphere of the reaction chamber 12.

$$Cl_2 + photon \rightarrow Cl. \quad (1)$$

$$Si + nCl. \rightarrow SiCl_n \uparrow \quad (2)$$

$$SiCl_n + O_2 \rightarrow SiO_2 \downarrow + n/2\ Cl_2 \uparrow \quad (3)$$

Silicon oxide is progressively deposited on the selected regions of the surface of the workpiece 15 in accordance with the above-mentioned reaction mechanism. The chlorine radical permeates the progressively deposited layer of silicon oxide and reaches the surface of the silicon mass constituting the workpiece 15 to etch it. The silicon halide produced permeates the silicon oxide layer and carries out a reaction represented by formula (3).

When the above-mentioned photochemical reaction is commenced, the total pressure prevailing in the reaction chamber 12 is generally set to range between $10^{-1}$ Torr and 760 Torr, or preferably between 10 Torr and 200 Torr. In this case the partial pressure of the raw material gas bears the ratio ranging between about 200:1 and about 1:10, or preferably between about 20:1 and about 2:1 to the partial pressure of the halogen-based gas.

As previously described, the method of this invention is usually carried out at a low temperature of 400° C. or less. If the temperature rises above 450° C., practically no insulating material is formed. A description may now be made of this fact with reference to the case where the raw gas is an oxygen-based gas and a silicon oxide layer is progressively depostied on the workpiece. At a temperature of 450° C. or more, the direct thermal oxidation of silicon by the oxygen-based gas proceeds in preference to the etching reaction in accordance with the formula (2). The reaction product, that is, a thermal oxide layer, is formed on the surface of the silicon mass and obstructs the etching reaction. However, the following fact has been found by the present inventors. After a photo-oxide layer is formed on the workpiece by the photochemical reaction process according to this invention with a thickness (about 100 nm or more) sufficient to prevent the permeation of the oxygen-containing gas at the low temperature, i.e., 400° C. or less, no thermal oxide layer is formed even if the temperature is raised to 450° C. or more (preferably 800° C. or less). In such a case, only the photochemical reaction according to this invention proceeds to provide a photo-oxide layer.

Now reference is made to the case where the workpiece is formed of silicon, the raw material gas is provided by oxygen-based gas, and silicon oxide is produced as an insulating material. If the ratio of the partial pressure of the halogen-based gas to the total pressure of the oxygen-based gas plus the halogen-based gas is optionally defined within the range of about 5 to about 33%, then it is possible to optionally vary the ratio of the total thickness of a deposited silicon photo-oxide layer to its thickness in the silicon workpiece (corresponding to an etched depth of the silicon workpiece). In other words, it is possible to render the surface of the deposited oxide layer flush with the initial surface of the workpiece or set the surface of the deposited oxide layer higher than the initial surface of the workpiece. Though the ratio of the above-mentioned thicknesses somewhat depends on the time of photochemical reaction and the total gas pressure in the reaction chamber, these factors exert only a slight effect. Practically, the aforementioned thickness ratio is substantially defined by the previously described partial pressure ratio. The total thickness of a silicon oxide layer produced by the ordinary thermal oxidation process generally bears a ratio of about 2.3 to the thickness of the silicon oxide layer lying in the silicon workpiece. That portion of the surface of the workpiece on which the thermally oxidized layer is to be deposited has to be previously etched in order to render the surface of the thermally oxidized layer flush with the initial surface of the silicon workpiece. The method of this invention can substantially achieve this object simply by letting the partial pressure of the halogen-based gas bear a prescribed ratio to the total pressure of the raw material gas plus the halogen-based gas.

This invention will become more apparent with reference to the following experiments.

Experiment 1

In this experiment, single crystal silicon and polycrystalline silicon doped with phosphorus (at a concentration of $2 \times 10^{20}/cm^3$) were used as a workpiece. These workpieces were provided with no masks. The raw material gas was oxygen, and the halogen-based gas was chlorine gas. The chlorine gas occupied 5% by volume of a mixture of the oxygen gas and chlorine gas.

The workpiece was placed on the susceptor 14 held in the reaction chamber 12 of the photochemical reaction device 10 shown in FIG. 1. After the workpiece was heated to 250° C., the pressure of the aforementioned gaseous mixture in the reaction chamber 12 was set at 200 Torr. Laser beams were vertically irradiated on the whole surface of the workpiece 15 for 30 minutes from a pulsed XeCl excimer laser (light source) which issues laser beams having a wavelength of 308 nm at the rate of 80 pulses per second with an average output 2 w/cm$^2$. As a result, a silicon dioxide layer was formed with a thickness of 400 nm on both workpieces.

When an oxide layer is to be formed at the same rate as in Experiment 1 by the thermal oxidation process, it is necessary to carry out a hydrogen combustion oxidation process at a temperature of 1000° C.

Control

The substantially same operation as in Experiment 1 was performed except that only oxygen gas was taken into the reaction chamber 12. In this case, no silicon oxide layer was formed on the above-mentioned two types of workpieces.

Experiment 2

Figure 3:
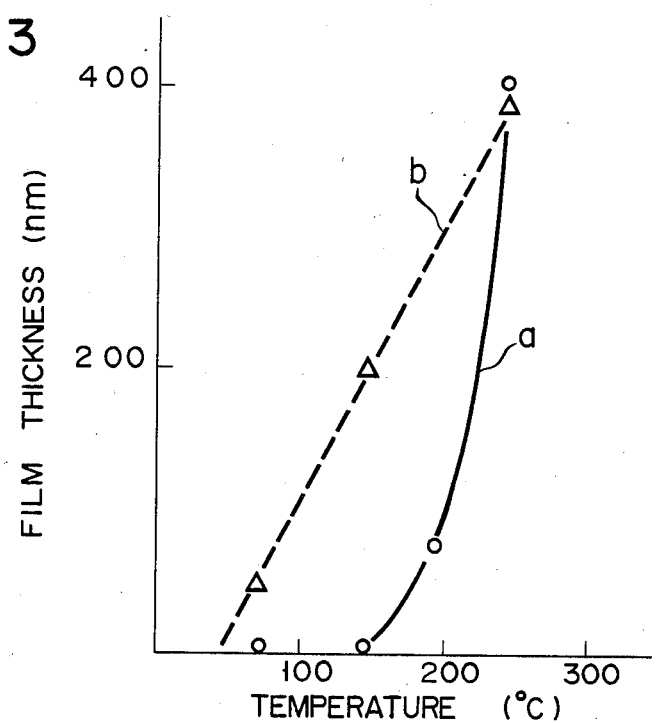
FIGS. 3 to 7 graphically show the results of experiments conducted according to the invention.

The substantially the same operation as in Experiment 1 was carried out except that the workpiece-heating temperature was varied. A measurement was made of a thickness of a photo-oxide layer produced. The result is set forth in FIG. 3. A solid line a relates to the single crystal silicon workpiece. A broken line b relates to the doped polycrystalline silicon workpiece. FIG. 3 shows that when a heating temperature of 150° C. or less was applied, a silicon dioxide layer was deposited on the phosphorus-doped polycrystalline silicon workpiece, but no silicon dioxide layer was formed on the single crystal silicon workpiece.

Experiment 3

In this Experiment, a single crystal silicon substrate was used as a workpiece. The reaction chamber 12 was filled with oxygen gas with a pressure of 200 Torr and chlorine gas with a pressure of 10 Torr. A laser beam was irradiated on the workpiece from the same source as in Experiment 1. A measurement was made of the relationship between the substrate-heating temperature and the growth rate of a photo-oxide layer formed. The results are set forth in FIG. 4.

Figure 4:
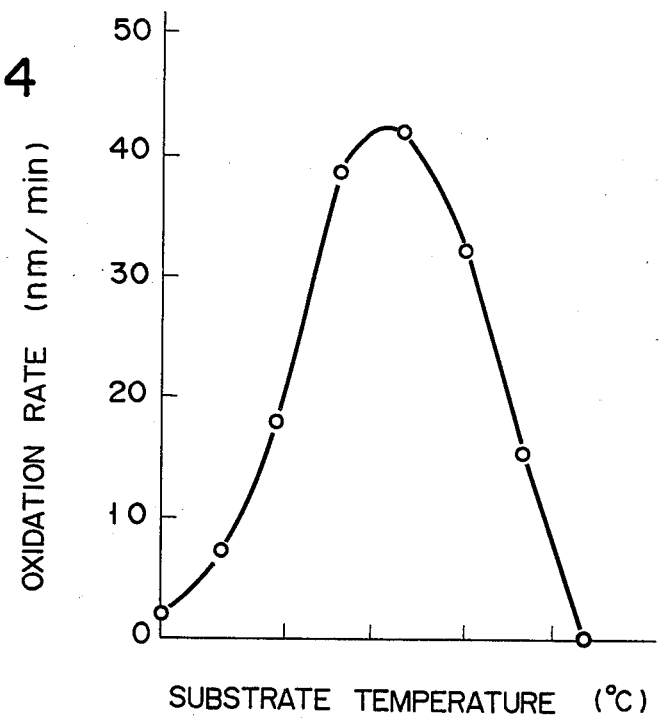

FIG. 4 shows that the rate of photochemical oxidation reaches a peak at 300° C. and tends to fall at higher temperatures, and the practical rate of photochemical oxidation is attained at a temperature ranging between 100° C. and 400° C. At 450° C., no photo-oxide layer was formed. As previously described, however, it was found that after photochemical oxidation was continued at a temprature not more than 400° C. until a photo-oxide layer was produced with a sufficient thickness to obstruct the permeation of oxygen, a photo-oxide layer was formed even when the temperature was raised above 450° C. thereafter.

Experiment 4

In this experiment, a single crystal substrate was used. The partial pressure of chlorine gas taken into the reaction chamber 12 was set at 10 Torr, and the partial pressure of oxygen gas to be added to the chlorine gas was varied, thus forming a silicon oxide layer on the single crystal substrate. The same light source as in Experiment 1 was used. The substrate was heated to 250° C., and reaction was carried out for 10 minutes. A measurement was made of the ratio of total thickness of the respective silicon dioxide layer formed in this experiment to the thickness of the layer in the substrate (corresponding to the depth to which the substrate was etched). The results are shown in FIG. 5.

Figure 5:
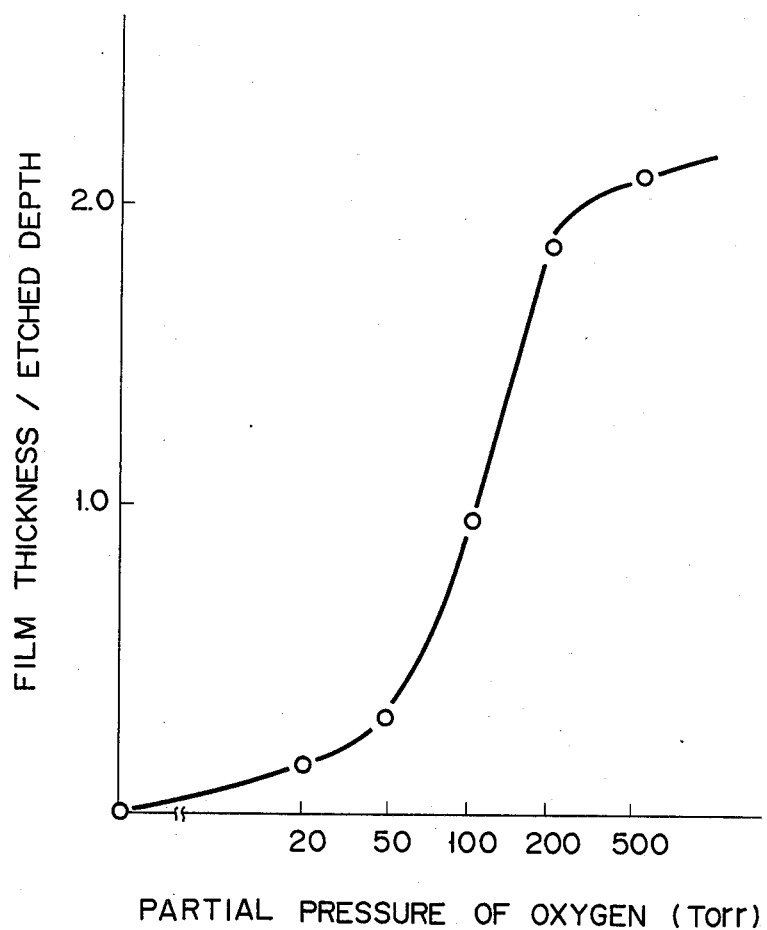

FIG. 5 indicates that within the oxygen partial pressure of 20 to 500 Torr (the ratio of oxygen gas to chlorine gas=2:1 to 50:1), the ratio of the total thickness of a photo-oxide layer to the etched depth of the substrate varied from 0.15 to 2.3. This variation in the ratio was particularly noticeable when the partial pressure of oxygen ranged from 20 to 200 Torr, namely, the ratio of the partial pressure of oxygen to that of chlorine gas ranged from 2:1 to 20:1 (namely, the content of chlorine gas in the gaseous mixture accounted for 5 to about 33% by volume). Therefore, it is possible to properly define the relative heights of the surface of the workpiece and that of the silicon dioxide layer (for instance, a flush pattern or projection) by suitably selecting the ratio in which the oxygen gas (oxygen-based gas) and chlorine gas (halogen-based gas) are mixed within the above-mentioned range of the partial pressure ratio of oxygen gas and chlorine gas.

When, in this Experiment, the partial pressure of oxygen gas was 200 Torr or more, the ratio of the total thickness of the photo-oxide layer to the etched depth of the substrate approximately reached a constant level. The reason is that when the partial pressure of oxygen gas is 200 Torr or more, silicon halide, a product of etching, reacts with oxygen at the rate of substantially 100%, producing silicon dioxide, which in turn is deposited on the workpiece.

Experiment 5

Figure 6:
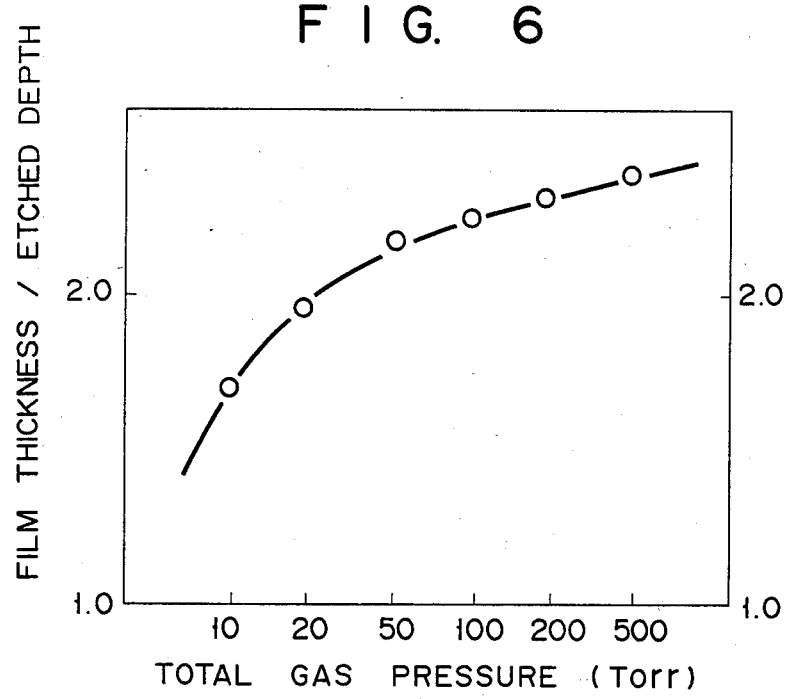

Substantially the same operation as in Experiment 4 was performed, except that the total pressure of oxygen gas and chlorine gas was varied while the ratio of oxygen gas to chlorine gas was fixed to 20:1. A measurement was made of the ratio of the total thickness of the silicon dioxide layer to the etched depth of the substrate, the results being set forth in FIG. 6.

Experiment 6

Figure 7:
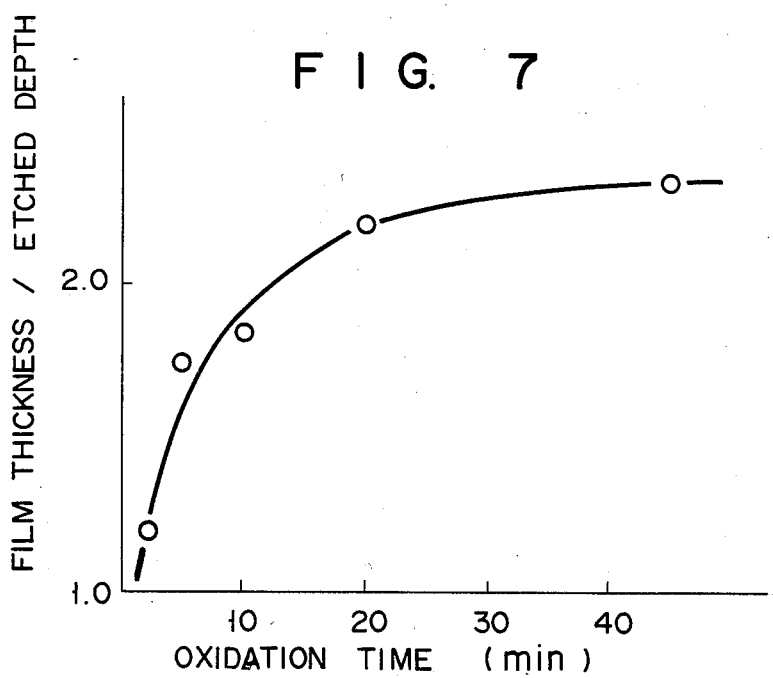

Substantially the same operation as in Experiment 4 was carried out, except that the partial pressure ratio of oxygen gas to chlorine gas was set at 20:1, the total pressure of these gases was fixed to 200 Torr and the reaction time was changed. A measurement was made of the ratio of the total thickness of a silicon dioxide layer to the etched depth of the substrate, the results being indicated in FIG. 7.

A comparative study is now made of Experiments 4 to 6. Though somewhat depending on the total pressure of a gaseous mixture constituting a reaction atmosphere, the ratio of the total thickness of the silicon dioxide layer to the etched depth of the substrate is substantially governed by the mixed ratio of the gases. If it is intended to more accurately control the surface condition of the silicon dioxide layer, it is preferred to properly select the mixed ratio of the gases constituting the reaction atmosphere in consideration of the effects exerted by the total pressure of the mixed gases and reaction time.

FIGS. 8A to 8C illustrate the process of selectively forming a silicon dioxide layer (acting as an element-isolating layer). As seen from FIG. 8A, a thermal oxide layer is formed over the entire surface of a single crystal silicon substrate 41 to a thickness of, for example, 100 nm. The thermal oxide layer is selectively etched to provide a mask pattern 42 comprising the remaining thermal oxide layer. The surface of the substrate 41 is selectively exposed by the mask pattern 42. The exposed portions of the surface of the substrate 41 define the regions in which a photo-oxide layer is to be deposited.

The substrate 41 of FIG. 8A is placed on the susceptor 14 of the photochemical reaction apparatus shown in FIG. 1, and a photochemical reaction according to this invention is carried out as described above. For example, a gaseous mixture consisting of 95% by volume of oxygen gas and 5% by volume of chlorine gas is introduced into the reaction chamber 12 at a pressure of 200 Torr. The silicon substrate 41 is heated to 250° C., and light rays are irradiated on the substrate for 60 minutes under the aforementioned conditions. As a result, as shown in FIG. 8B, a silicon dioxide layer 43 is deposited only on those portions of the substrate 41 which are not covered with the mask pattern in the form raised above the initial surface 41a of the substrate 41 (a total thickness of 600 nm). On the other hand, when a gaseous mixture consisting of, for example, oxygen gas (100 Torr) and chlorine gas (10 Torr) is carried into the reaction chamber 12, and a photochemical reaction is performed under the same conditions as just described above, the surface of the deposited silicon dioxide layer 43' is made flush with the initial surface 41a of the substrate 41, as shown in FIG. 8C.

After the deposition of the silicon dioxide layer 43 or 43', the structure of FIGS. 8B or 8C is subjected to heat treatment, for example, at a temperature of 1000° C. for 30 minutes, and then dipped, for example, in an aqueous solution of ammonium fluoride for one minute to etch that portion of the silicon dioxide layer corresponding to the thickness of the mask 42. As a result, those portions of the surface of the substrate 41 which have been covered with the mask 42 are exposed. The exposed portions constitute element-forming regions surrounded by the remaining photo-oxide layer.

When a light-permeable mask such as a silicon dioxide layer is applied, a photochemical insulation layer of this invention tends to be slightly formed under the edge portion of the mask.

FIGS. 9A and 9B illustrate the process of forming a buried insulation layer according to this invention. First, as shown in FIG. 9A, a silicon dioxide layer 52 is formed on a single crystal silicon substrate 51 by the ordinary process to a thickness of, for example, 800 nm. A polycrystalline silicon layer 53 is formed on the silicon dioxide layer 52 to a thickness of, for example, 800 nm. Aluminium wiring layers 54a, 54b are selectively formed on the polycrystalline silicon layer 53 to a thickness of, for example, 700 nm.

The structure shown in FIG. 9A is placed in the reaction apparatus 10 of FIG. 1. Then, a photochemical reaction according to this invention is carried out, providing insulation layers 55a, 55b, 55c formed of silicon dioxide (FIG. 9B). At this time, the whole surface of the aluminium wiring layers 54a, 54b are covered with an aluminium oxide layer. This aluminium oxide layer obstructs the reaction represented by the aforementioned formula (2) (namely, the aluminium wire acts as a mask). When the photochemical reaction according to this invention is carried out by conducting a gaseous mixture consisting of 95% by volume of oxygen gas and 5% by volume of chlorine gas into the reaction chamber at a pressure of 200 Torr, heating is performed at a temperature of 250° C., and an excimer laser is irradiated for 30 minutes, then those portions of the polycrystalline silicon layer 53 which are not covered with the aluminium wiring layers 54a, 54b are oxidized, thereby providing buried silicon dioxide insulation layers 55a, 55b, 55c substantially flush with the surface of the aluminium wiring layers 54a, 54b. If, therefore, other wiring layers are successively deposited on the above-mentioned flush structure, the other wiring layers can be formed without any patterning error and the occurrence of undesirable breakage at a stepped portion.

When a light-impermeable mask such as the wiring layers 54a, 54b is used, substantially no photochemical insulating layer is produced thereunder.

Figure 10A:
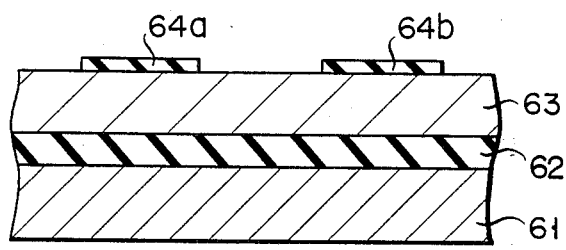
FIGS. 10A to 10C are sectional views setting forth the process of forming an intervening insulation layer for insulating a wiring layer according to the invention.
Figure 10B:
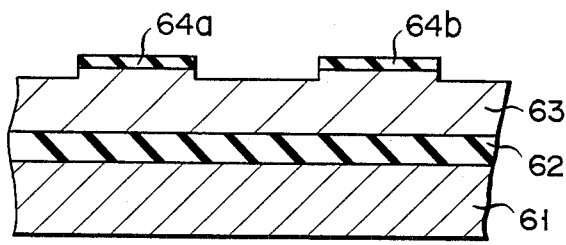
Figure 10C:
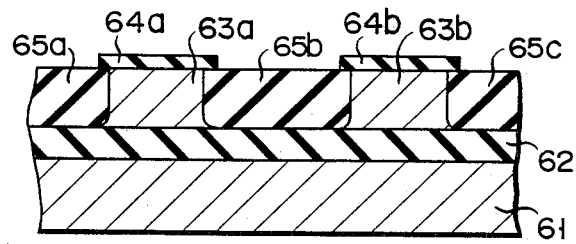

FIGS. 10A to 10C illustrate the process of providing a patterned wiring layer by selectively forming intervening insulation layers in a metal layer according to this invention. First, as shown in FIG. 10A, a silicon dioxide layer 62 is formed on a single crystal silicon substrate 61 by the customary method. An aluminium layer 63 is formed on the silicon dioxide layer 62, and masks 64a, 64b prepared from silicon dioxide are formed thereon.

As previously described, when exposed to the surrounding oxidizing atmosphere (e.g., air), the aluminium layer 63 has its surface readily oxidized, thereby providing an alumina layer. For the removal of the alumina layer, the structure shown in FIG. 10A is placed in a reaction apparatus indicated in FIG. 1. Thereafter, boron trichloride (BCl₃), for example, is introduced into the reaction chamber 12, and carbon dioxide laser is irradiated to etch the alumina layer. As a result, those portions of the aluminium layer 63 which are exposed from the masks 64a, 64b are slightly etched, thus providing a structure indicated in FIG. 10B.

After the etching of the alumina, gases remaining in the reaction chamber 12 are completely discharged. Then the raw material gas (for example, oxygen gas) and halogen-based gas (for example, chlorine gas) are introduced into the reaction chamber 12. A photochemical reaction according to this invention is conducted by applying an excimer laser, as described above. As a result, those portions of the aluminium layer 63 which are not covered with the masks 64a, 64b are selectively oxidized to provide aluminium oxide layers 65a, 65b, 65c (FIG. 10C). Those portions 63a, 63b of the aluminium layer 63 which are not oxidized can be utilized as wiring layer.

Figure 11:
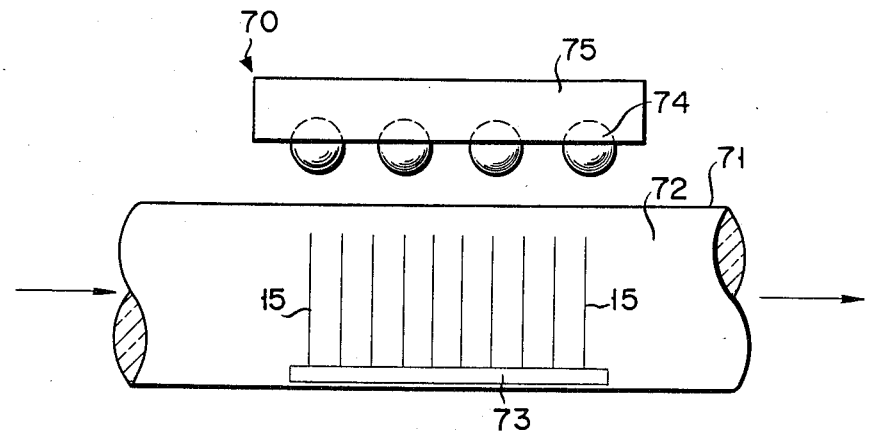
FIG. 11 schematically shows another photochemical reaction device used for carrying out the invention.

FIG. 11 shows a reaction apparatus adapted to treat a relatively large number of workpieces in an relatively narrow reaction chamber in accordance with this invention. This reaction apparatus 70 comprises a quartz tube 71 defining a reaction chamber 72. A boat 73 is placed in the quartz tube 71 to support a large number of workpieces 15. The workpieces 15 are held on the boat 73 in an upright position. Provided above the quartz tube 71 is a light reflector 75 to support a plurality of halogen lamps 74. The raw material gas and halogen-based gas are introduced into the quartz tube 71 at one end and discharged therefrom at the other end. When the reaction apparatus 70 is used, a light beam is brought into the quartz tube 71 in parallel with the surfaces of the plural workpieces 15. Under such condition, an insulation layer is grown at a slower rate than when a light beam is introduced into the quartz tube 71 perpendicularly to the surface of the workpieces 15. In fact, when a gaseous mixture consisting of 99% by volume of oxygen gas and 1% by volume of chlorine gas was introduced into the reaction chamber 72 of the reaction apparatus of FIG. 11 and a light was irradiated from the halogen lamps 74 on the plural workpieces 15 for 60 minutes while the quartz tube 71 was heated to 300° C., a silicon dioxide layer was formed on the workpieces 15 with a thickness of 200 nm. This rate at which the silicon dioxide layer was formed was smaller than when a light beam was perpendicularly irradiated on the workpieces 15. However, the application of the reaction apparatus 70 of FIG. 11 ensures the simultaneous treatment of a large number of workpieces 15.

As previously mentioned, since the method of this invention is carried out at a lower temperature, a workpiece is prevented from being broken or warped when taken into or out of a reaction chamber. The other characteristics of this invention are that when a photochemical silicon dioxide layer is formed on a silicon workpiece, it is possible to use as a mask a silicon dioxide layer formed by thermal oxidation or the CVD process. Therefore, it is unnecessary to use a silicon nitride mask when an element-isolating silicon oxide layer is formed as in the conventional thermal oxidation process. Further, the relative positions or heights of the surface of a deposited insulation layer and the initial surface of a workpiece can be substantially controlled by adjusting the ratio of the partial pressures of the raw material gas and halogen-based gas.

What is claimed is:

1. A method of selectively forming an insulation layer which comprises the steps of:
  exposing a workpiece whose surface layer comprises a non-insulating material to an atmosphere comprising a gaseous mixture of a halogen-based gas and a raw material gas containing an element chemically bondable with an element of said non-insulating material to form an insulating compound;
  directly irradiating a light ray on a selected surface region of the workpiece through said atmosphere while heating said workpiece to a prescribed temperature, thereby dissociating said halogen-based gas; and
  forming a layer comprising said insulating compound on said selected surface region of said workpiece on which said light ray has been directly irradiated.

2. The method according to claim 1, wherein said selected surface region of said workpiece is defined by a mask means selectively formed on said workpiece.

3. The method according to claim 2, wherein said mask means comprises silicon dioxide or aluminum.

4. The method according to claim 2, wherein said mask means is impermeable to said light ray.

5. The method according to claim 1, wherein the raw material gas is oxygen-based gas.

6. The method according to claim 1, wherein said raw material gas is a nitriding gas.

7. The method according to claim 1, wherein said workpiece is heated to a temperature ranging between 100° C. and 400° C.

8. The method according to claim 1, wherein said light ray is irradiated on the workpiece in a direction perpendicular to the surface thereof.

9. The method according to claim 1, wherein said halogen-based gas is chlorine gas.

10. The method according to claim 1, wherein the surface layer of said workpiece comprises a metal or a semiconductor material.

11. The method according to claim 1, wherein the surface layer of said workpiece comprises silicon.

12. A method of selectively forming a silicon dioxide layer which comprises the steps of:
  exposing a surface of a workpiece whose surface layer comprises silicon to an atmosphere comprising a gaseous mixture of an oxygen-based gas and halogen-based gas;
  directly irradiating a light ray only on a selected surface region of said workpiece through said atmosphere, while heating said workpiece to a temperature of 100° C. to 400° C., thereby dissociating said halogen-based gas to generate a halogen radical;
  etching the surface of said selected region of said workpiece by means of said halogen radical, thereby producing silicon halide;
  reacting said silicon halide with said oxygen-based gas involved in said atmosphere, thereby producing photochemical silicon dioxide; and
  depositing said photochemical silicon dioxide on said selected surface region of said workpiece.

13. The method according to claim 12, wherein said oxygen-based gas accounts for about 5 to about 33% of said gaseous mixture.

14. The method according to claim 12, wherein said oxygen-based gas is an oxygen gas.

15. The method according to claim 14, wherein said halogen-based gas is a chlorine gas.

16. The method according to claim 15, wherein said selected surface region of said workpiece is defined by a mask means selectively formed on the surface of said workpiece.

17. The method according to claim 16, wherein said mask means comprises silicon dioxide or aluminum.

18. The method according to claim 12, wherein said light ray is perpendicularly irradiated on the surface of said workpiece.

19. The method according to claim 12, which comprises forming said photochemical silicon dioxide at a temperature of 100° C. to 400° C. with a thickness sufficient to suppress the permeation of said oxygen-based gas and thereafter further heating said workpiece at a temperature higher than 450° C.

20. The method according to claim 19, wherein said workpiece is further heated to a temperature of 800° C. or less.

* * * * *